United States Patent
Watanabe (10) Patent No.: US 7,283,168 B2
(45) Date of Patent: Oct. 16, 2007

(54) AMPLIFICATION TYPE SOLID-STATE IMAGE PICKUP HAVING A THREE STAGE RESET PERIOD FOR A PIXEL

(75) Inventor: Takashi Watanabe, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 1012 days.

(21) Appl. No.: 10/353,397

(22) Filed: Jan. 29, 2003

(65) Prior Publication Data
US 2003/0141497 A1 Jul. 31, 2003

(30) Foreign Application Priority Data
Jan. 29, 2002 (JP) .............................. 2002-020302

(51) Int. Cl.
H04N 3/14 (2006.01)
(52) U.S. Cl. .................... 348/308; 348/301; 250/208.1
(58) Field of Classification Search ..................... None
See application file for complete search history.

(56) References Cited

U.S. PATENT DOCUMENTS

| 6,760,070 B1 * | 7/2004 | Merrill et al. ............... 348/294 |
| 6,864,920 B1 * | 3/2005 | Kindt et al. ................. 348/308 |
| 2002/0003581 A1 * | 1/2002 | Sato et al. ............. 348/333.11 |

OTHER PUBLICATIONS

Mabuchi et al., "*A ¼ Inch 330K Pixel VGA CMOS Image Sensor*", Technical Report of the Institute of Image Information and Television Engineers, vol. 21, No. 21, pp. 25-30, IPU'97-13, Mar. 1997.
Bedabrata Pain et al., "*Analysis and enhancement of low-light-level performance of photodiode-type CMOS active pixel imagers operated with sub-threshold reset*", IEEE Workshop on CCDs and Advance Image Sensors 1999, pp. 140-143.

* cited by examiner

*Primary Examiner*—Vivek Srivastava
*Assistant Examiner*—Anthony J. Daniels
(74) *Attorney, Agent, or Firm*—David G. Conlin; David A. Tucker; Edwards Angell Palmer & Dodge LLP

(57) ABSTRACT

An amplification type solid-state image pickup device has a plurality of pixels each of which comprises a photodiode 4, a signal-amplification-use MOS transistor 1 for amplifying signal charges stored in the photodiode 4, a reset-use MOS transistor 2 for resetting signal charges stored in the photodiode 4, and a pixel-selection-use MOS transistor 3 for selecting a signal amplified by the signal-amplification-use MOS transistor 1. During a first period, a reset drain voltage VP(i) is turned and held in a Low state. During second and third periods thereof, the reset drain voltage VP(i) is changed to a High state. A reset gate voltage RS(i) is set to a first voltage ($V_{DD}-\Delta V$) during the first and second periods, and the reset gate voltage RS(i) is set to a second voltage $V_{DD}$ higher than the first voltage by a specified voltage $\Delta V$ during the third period.

5 Claims, 8 Drawing Sheets

AMPLIFICATION TYPE SOLID-STATE IMAGE PICKUP HAVING A THREE STAGE RESET PERIOD FOR A PIXEL

BACKGROUND OF THE INVENTION

The present invention relates to an amplification type solid-state image pickup device.

Conventionally, there has been proposed an amplification type solid-state image pickup device having a pixel area, in which an amplification function is imparted to each pixel, and scanning circuits provided around the pixel area, where pixel data is read by the scanning circuits. Among others, there have been known an APS (Active Pixel Sensor) type image sensor composed of CMOS which is advantageous for integration of the pixel area with its surrounding drive circuit and signal processing circuit.

For the APS type image sensor, it is necessary to provide a photoelectric conversion part, an amplification part, a pixel selector part and a reset part within one pixel. Typically, the photoelectric conversion part is formed of a photodiode (PD), and the amplification part, the pixel selector part and the reset part are implemented by using three to four MOS transistors (Tr).

Figure 5:
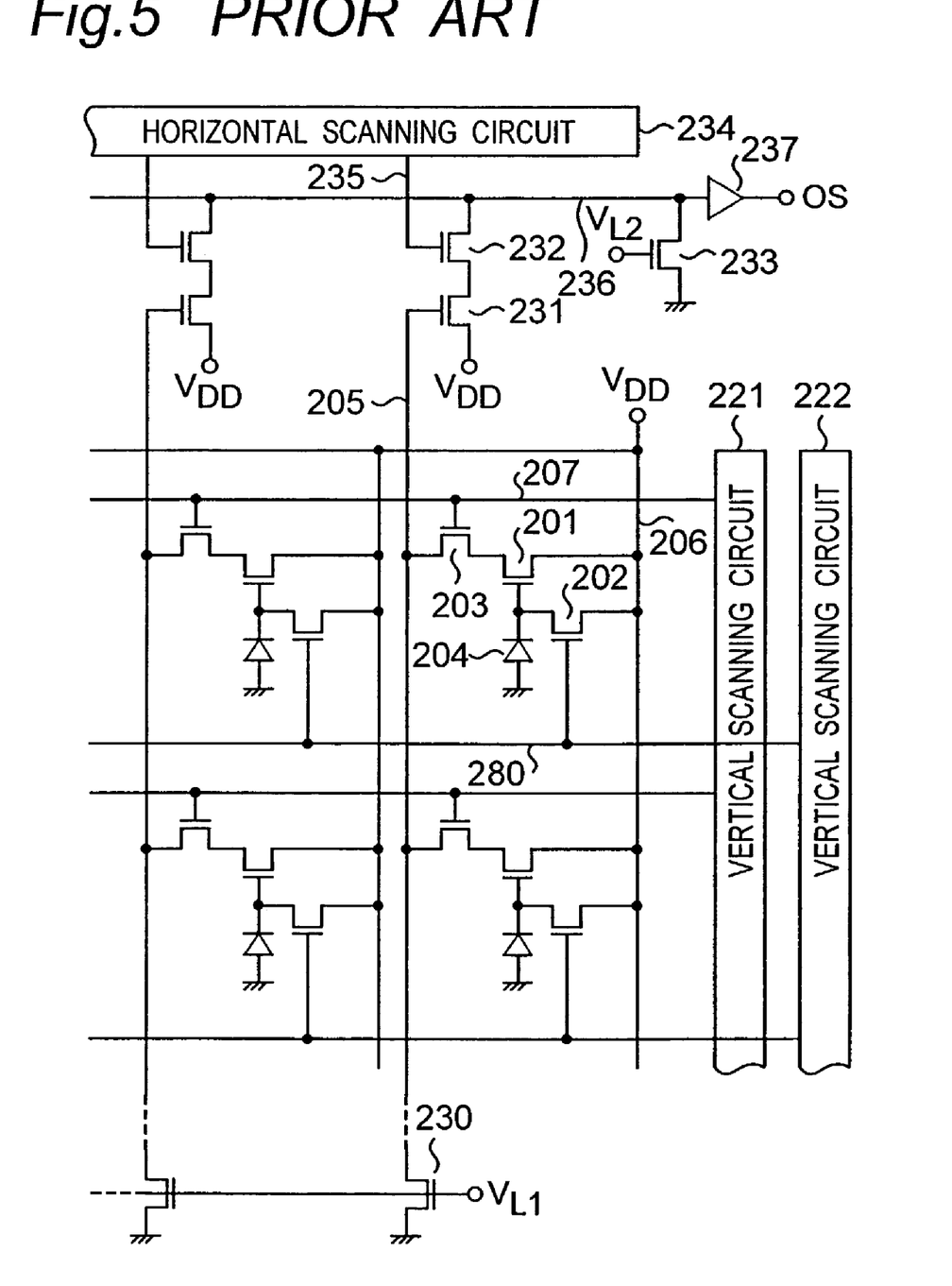
FIG. 5 is a view showing a circuit construction of an amplification type solid-state image pickup device according to a prior art.

FIG. 5 shows a construction of an APS type image sensor which is of the PD+3Tr style with the use of one photodiode (PD) and three MOS transistors (Tr). This PD+3Tr style is disclosed in, for example, Mabuchi et al., "A ¼ Inch 330 k Pixel VGA CMOS Image Sensor" (Technical Report of the Institute of Image Information and Television Engineers, IPU'97-13, March, 1997).

Referring to FIG. 5, reference numeral 201 denotes an amplification-use MOS transistor, 202 denotes a reset-use MOS transistor, 203 denotes a pixel-selection-use MOS transistor, 204 denotes a photoelectric-conversion-use photodiode, 205 denotes a signal line, 206 denotes a power supply line, 207 denotes a pixel-selection clock line, and 280 denotes a reset clock line. The pixel-selection-use MOS transistor 203 is driven by a vertical scanning circuit 221 via the pixel-selection clock line 207. Also, the reset-use MOS transistor 202 is driven by a vertical scanning circuit 222 via the reset clock line 280. Further, a MOS transistor 230 (gate bias voltage: $V_G$), which serves as a constant-current load, is connected to the signal line 205, where an output voltage of the signal line 205 is read to a horizontal signal line 236 via an amplifier (amplification-use MOS transistor) 231 and a MOS transistor 232. The MOS transistor 232 is driven by a horizontal scanning circuit 234 via a horizontal clock line 235. A MOS transistor 233 (gate bias voltage: $V_{L2}$), which serves as a constant-current load, is connected to the horizontal signal line 236, and a voltage of the horizontal signal line 236 is amplified by an amplifier 237 so as to be outputted as a signal OS.

Figure 6:
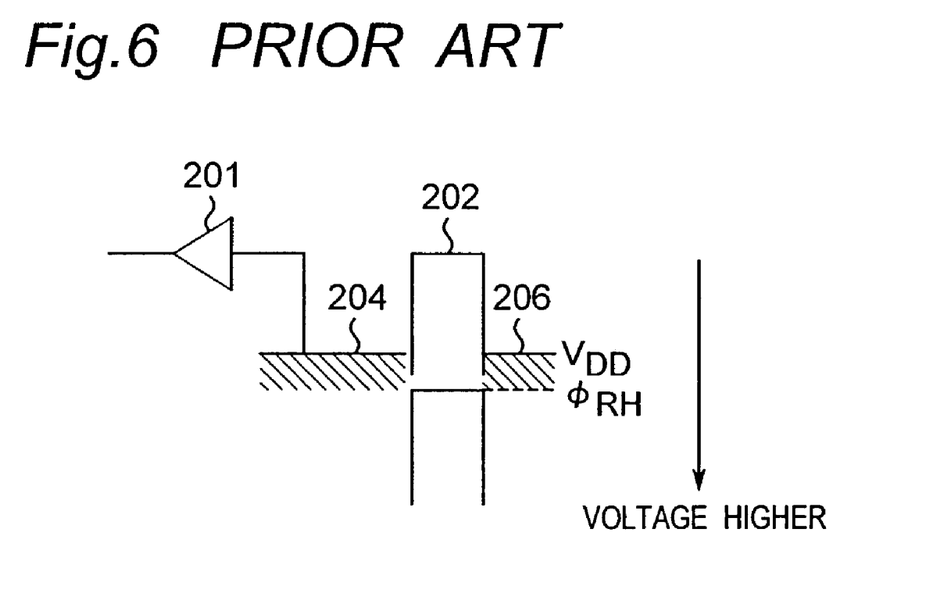
FIG. 6 is a potential diagram in a hard reset operation of the amplification type solid-state image pickup device.

In the amplification type solid-state image pickup device shown in FIG. 5, assuming that the under-gate channel voltage for turn-on of the reset-use MOS transistor 202 is $\phi_{RH}$ and that the reset drain voltage is a power supply voltage $V_{DD}$, and given that $$V_{DD} < \phi_{RH},$$

then, as shown in FIG. 6, when the reset-use MOS transistor 202 is turned on, the voltage of the photodiode 204 is reset to the power supply voltage $V_{DD}$. However, after the reset-use MOS transistor 202 has turned off, the photodiode 204 yields occurrence of reset noise $\Delta$Nrn expressed in electron numbers as:

$$\Delta Nrn = (\sqrt{kTC_p})/q \tag{1}$$

where k is Boltzmann's constant, T is an absolute temperature, $C_p$ is a capacitance of the photodiode 204 and a region adjoining thereto, and q is the elementary electric charge. As apparent from the above Equation (1), the reset noise $\Delta$Nrn depends on the capacitance $C_p$, and increases with increasing capacitance $C_p$. In the following description, resetting the voltage of the photodiode 204 by such a reset-use MOS transistor 202 is defined as a "hard reset opration."

As apparent from FIG. 5, since the capacitance $C_p$ includes, in addition to the capacitance of the photodiode 204 itself, the gate capacitance of the amplification-use MOS transistor 201 as well as an interconnecting capacitance of these, it is difficult to reduce the reset noise $\Delta$Nrn. That is, in the case of the construction of FIG. 5, the reset noise $\Delta$Nrn has been a large issue.

Therefore, as a method for reducing the reset noise as described above, there has been proposed a noise reduction method by a "soft reset operation" as shown below (Bedabrata Pain et al., Analysis and enhancement of low-light-level performance of photodiode-type CMOS active pixel imagers operated with sub-threshold reset, IEEE Workshop on CCDs and Advanced Image Sensors 1999, p.140).

Figure 7:
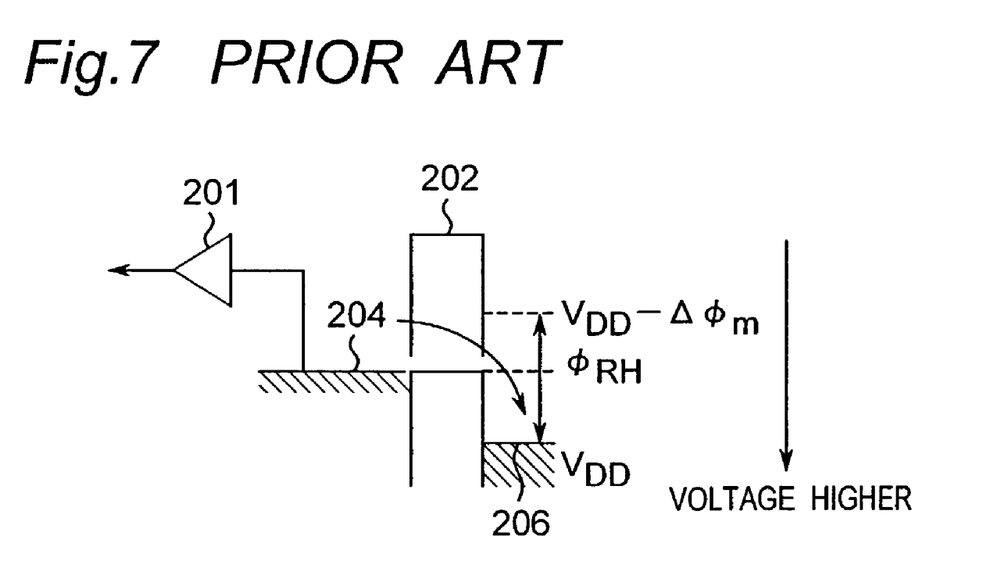
FIG. 7 is a potential diagram in a soft reset operation of another amplification type solid-state image pickup device according to a prior art.

FIG. 7 shows potential relations in the pixel area during this soft reset operation. Hereinbelow, the soft reset operation is explained with reference to FIG. 7. It is noted that the amplification type solid-state image pickup device in this case is similar in construction to the amplification type solid-state image pickup device of FIG. 5 except the operation timing.

Referring to FIG. 7, upon a turn-on of the reset-use MOS transistor 202, if the under-gate channel voltage $\phi_{RH}$ satisfies a relation that $$\phi_{RH} < V_{DD},$$

then the voltage of the photodiode 204 is reset to a sub-threshold region around the under-gate channel voltage $\phi_{RH}$. In this case, after the reset-use MOS transistor 202 is turned off, the photodiode 204 yields occurrence of soft reset noise $\Delta$Nsr expressed in electron numbers as:

$$\Delta Nsr = (\sqrt{kTC_p/2})/q \tag{2}$$

That is, in this soft reset operation, noise is reduced to $\sqrt{(1/2)}$=0.71 time that of the hard reset operation of the case of Equation (1), in terms of electron number.

However, in the case where the voltage of the drain of the reset-use MOS transistor 202 is fixed to the power supply voltage $V_{DD}$ in FIG. 7, since the voltage of the photodiode 204 is not fixed because of leaks due to the sub-threshold current at the gate of the reset-use MOS transistor 202, there is a problem that image retention would occur.

Therefore, in order to avoid this problem, it has been proposed to perform the hard reset operation before the soft reset operation. That is, before the soft reset operation, the reset drain voltage is once set to a voltage ($V_{DD}-\Delta\phi_m$) which is lower than the under-gate channel voltage $\phi_{RH}$. As a result, since the voltage of the photodiode 204 is fixed to ($V_{DD}-\Delta\phi_m$), the voltage of the photodiode 204 shifted by leaks due to the sub-threshold current is fixedly set every store period, so that there would occur no image retention. A circuit diagram in this case is shown in FIG. 8, and its timing charts are shown in FIGS. 9A to 9H.

Figure 8:
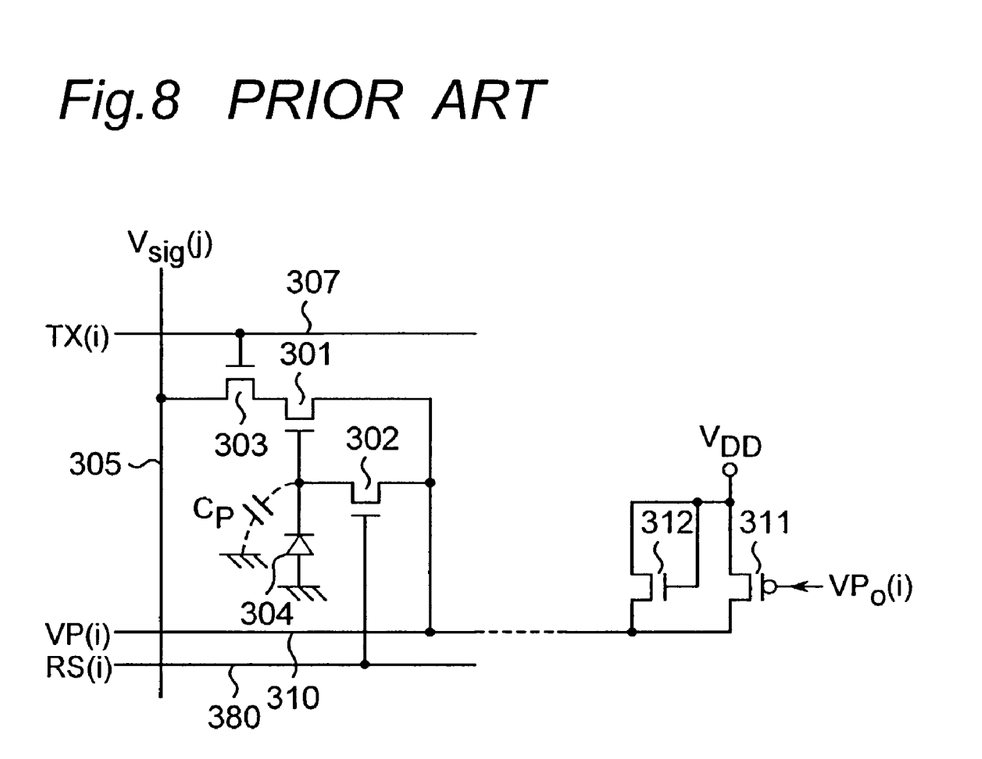
FIG. 8 is a view showing a circuit construction of still another amplification type solid-state image pickup device according to a prior art.
Figures 9A, 9B, 9C:
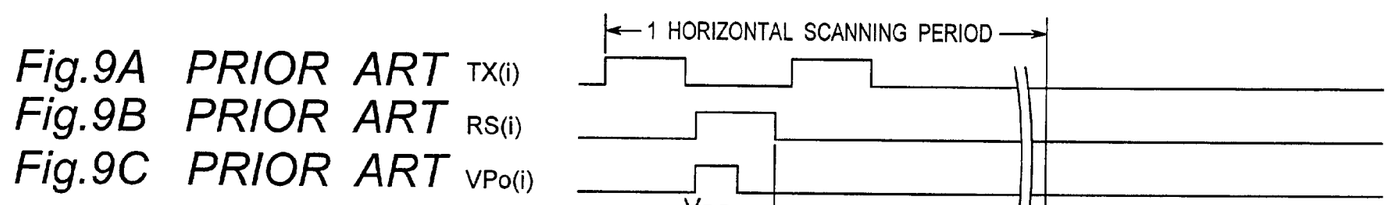
FIGS. 9A to 9H are timing charts of driving pulses of the amplification type solid-state image pickup device.
Figures 9D, 9E, 9F, 9G, 9H:
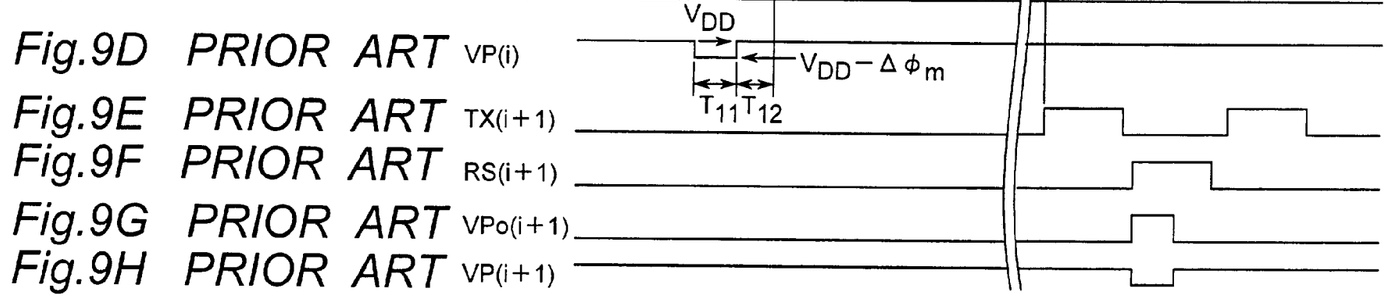

Referring to FIG. 8, reference numeral 301 denotes an amplification-use MOS transistor, 302 denotes a reset-use MOS transistor, 303 denotes a pixel-selection-use MOS transistor, 304 denotes a photoelectric-conversion-use photodiode, 305 denotes a signal line, 307 denotes a pixel-selection clock line, and 310 denotes a power supply line to which drains of the amplification-use MOS transistor 301 and the reset-use MOS transistor 302 are connected and which horizontally extends in units of rows of the pixel array. A reset drain voltage VP(i) is applied to the drain of the reset-use MOS transistor 302 via the power supply line 310. Also, reference numeral 380 denotes a reset clock line to which the gate of the reset-use MOS transistor 302 is connected and which horizontally extends in units of rows of the pixel array. A reset gate voltage RS(i) is applied to the gate of the reset-use MOS transistor 302 via the reset clock line 380.

The reset drain voltage VP(i) is changed between binary levels by MOS transistors 311, 312 and a pulse VPo(i). That is, when the pulse VPo(i) is at a Low level, the MOS transistor 311 is turned on, so that the reset drain voltage VP(i) becomes $$VP(i)=V_{DD}.$$

Meanwhile, when the pulse VPo(i) is at a High level, the MOS transistor 311 is turned off, so that the reset drain voltage VP(i) lowers from the power supply voltage $V_{DD}$ by a voltage drop $\Delta\phi_m$ of the MOS transistor 312, becoming $$VP(i)=V_{DD}-\Delta\phi_m,$$

and the resulting reset drain voltage VP(i) is applied to the power supply line 310. Timings for these operations are shown in the timing charts of FIGS. 9A to 9H.

Referring to FIGS. 9A to 9H, in a reset period ($T_{11}+T_{12}$) during which the reset gate voltage RS(i) keeps at the High level, the reset drain voltage VP(i) in its first half period $T_{11}$ becomes $$VP(i)=V_{DD}-\Delta\phi_m,$$

where ensuring that $$V_{DD}-\Delta\phi_m<\phi_{RH}$$

allows the voltage of the photodiode 304 to be fixed to ($V_{DD}-\Delta\phi_m$). That is, the hard reset operation is performed.

Next, in the second half period $T_{12}$, the reset drain voltage VP(i) becomes the power supply voltage $V_{DD}$, where setting the under-gate channel voltage $\phi_{RH}$ $$\phi_{RH}<V_{DD}$$

allows the soft reset operation to be performed.

However, with the noise reduction method of the "hard reset operation to soft reset operation" type shown in FIGS. 8 and 9A to 9H, although image retention is avoided, yet the reset noise is reduced only to at most 0.71 time that of the normal hard reset operation, in terms of electron numbers, as shown in Equation (2), which is an insufficient level for image sensors of high image quality.

Accordingly, an object of the present invention is to provide an amplification type solid-state image pickup device capable of greatly reducing the reset noise with an extremely simple construction.

SUMMARY OF THE INVENTION

In order to achieve the above object, according to the present invention, there is provided an amplification type solid-state image pickup device having an array of a plurality of pixels each of which comprises: a photoelectric conversion device; a signal-amplification-use MOS transistor for amplifying signal charges stored in the photoelectric conversion device; a reset-use MOS transistor for resetting signal charges stored in the photoelectric conversion device; and a pixel-selection-use MOS transistor for selecting a signal amplified by the signal-amplification-use MOS transistor, wherein a reset period during which the reset-use MOS transistor is turned and held on comprises a first period, a second period and a third period, the amplification type solid-state image pickup device further comprising control means for performing control operations that during the first period, drain voltage of the reset-use MOS transistor is turned and held in a Low state while gate voltage of the reset-use MOS transistor is set to a first voltage; during the second period, the drain voltage of the reset-use MOS transistor is turned and held in a High state while the gate voltage of the reset-use MOS transistor is held at the first voltage; during the third period, while the drain voltage of the reset-use MOS transistor is held in the High state, the gate voltage of the reset-use MOS transistor is set to a second voltage higher than the first voltage by a specified voltage.

With this constitution, during the first period, the drain voltage of the reset-use MOS transistor is changed to the Low state and moreover the gate voltage of the reset-use MOS transistor is set to the first voltage by the control means, so that the voltage of the photoelectric conversion device is reset to the drain voltage of the Low state. During the succeeding second period, the drain voltage of the reset-use MOS transistor is changed to the High state and moreover the gate voltage of the reset-use MOS transistor is held at the first voltage, so that the voltage of the photoelectric conversion device is reset to the under-gate channel voltage. Further, during the third period, the drain voltage of the reset-use MOS transistor is held in the High state and moreover the gate voltage of the reset-use MOS transistor is set to the second voltage higher than the first voltage by the specified voltage, where the under-gate channel voltage is elevated to an extent corresponding to the specified voltage, so that charges are injected into the photoelectric conversion device and the voltage of the photoelectric conversion device is reset to the elevated under-gate channel voltage. As a result, noise occurrence due to this reset operation is reduced to a large extent.

Also, in an embodiment, given that the specified voltage is $\Delta V$, a condition that $$\Delta V \leq kT/(2q)$$

(where k is Boltzmann's constant, T is an absolute temperature, and q is the elementary electric charge) is satisfied.

According to this embodiment, the specified voltage $\Delta V$ is set to a value larger than $kT/(2q)$, by which a large extent of noise reduction becomes implementable. For example, given that $$\Delta V=kT/(8q),$$

then the resulting noise expressed in electron numbers can be reduced to 0.35 time that of the hard reset operation and 0.5 time that of the soft reset operation.

Also, in an embodiment, if an under-gate channel voltage of the reset-use MOS transistor resulting when the gate voltage of the reset-use MOS transistor is the first voltage is assumed to be $\phi_{RH}$, then the voltage of the drain of the reset-use MOS transistor in a High state is higher than the under-gate channel voltage $\phi_{RH}$ of the reset-use MOS transistor and the voltage of the drain of the reset-use MOS transistor in a Low state is lower than the under-gate channel voltage $\phi_{RH}$ of the reset-use MOS transistor.

According to this embodiment, the voltage of the drain of the reset-use MOS transistor in its High state is set to a voltage higher than the under-gate channel voltage $\phi_{RH}$ of the reset-use MOS transistor, so that the voltage of the photoelectric conversion device can be reset to the under-gate channel voltage $\phi_{RH}$ during the second and third periods. Further, the voltage of the drain of the reset-use MOS transistor in its Low state is set to a voltage lower than the under-gate channel voltage $\phi_{RH}$, so that the voltage of the photoelectric conversion device can be reset to a voltage lower than the under-gate channel voltage $\phi_{RH}$ during the first period.

Also, in an embodiment, the plurality of pixels are arrayed in a matrix and wherein the control means comprises:

a first scanning circuit to which drains of the reset-use MOS transistors of the plurality of pixels are connected on a row basis, and which serves for applying a bi-level pulsed drive voltage to the drains of the reset-use MOS transistors one after another on the row basis; and a second scanning circuit to which gates of the reset-use MOS transistors of the plurality of pixels are connected on a row basis, and which serves for applying a tri-level pulsed drive voltage to the gates of the reset-use MOS transistors one after another on the row basis.

According to this embodiment, by the first scanning circuit to which drains of the reset-use MOS transistors of the plurality of pixels are connected on a row basis, a bi-level (voltages of Low state and High state) pulsed drive voltage is applied to the drains of the reset-use MOS transistors one after another on the row basis. By the second scanning circuit to which gates of the reset-use MOS transistors of the plurality of pixels are connected on a row basis, a tri-level (Low-level voltage, first voltage and second voltage) pulsed drive voltage is applied to the gates of the reset-use MOS transistors one after another on the row basis. As a result, voltages of the photoelectric conversion devices of the plurality of pixels arrayed in a matrix can be reset one after another on the row basis.

Also, in an embodiment, the amplification-use MOS transistor and the pixel-selection-use MOS transistor are connected in series to each other, the amplification type solid-state image pickup device further comprises:

a signal line to which one end out of both ends of the amplification-use MOS transistor and the pixel-selection-use MOS transistor connected in series is connected;

a power supply line to which the other end out of both ends of the amplification-use MOS transistor and the pixel-selection-use MOS transistor connected in series is connected; and a third scanning circuit to which gates of the pixel-selection-use MOS transistors are connected on a row basis, and which serves for applying a pulsed drive voltage to the gates of the pixel-selection-use MOS transistors one after another on the row basis.

According to this embodiment, signal charges stored in the photoelectric conversion device are amplified by the amplification-use MOS transistor connected to the power supply line. Furthermore, by the third scanning circuit to which gates of the pixel-selection-use MOS transistors are connected on a row basis, a pulsed drive voltage is applied to the gates of the pixel-selection-use MOS transistors one after another on the row basis. Thus, the signal charges amplified by the amplification-use MOS transistors can be read to the signal line via the pixel-selection-use MOS transistors that have been selected and turned on.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the amplification type solid-state image pickup device of the present invention is described in detail by way of embodiments thereof illustrated in the accompanying drawings.

The following explanation is given in the case of using n-type channel MOS transistors. However, the same explanation is applied to the case of using p-type channel MOS transistors except that the polarity of voltage is inverted.

First Embodiment

Figure 1A:
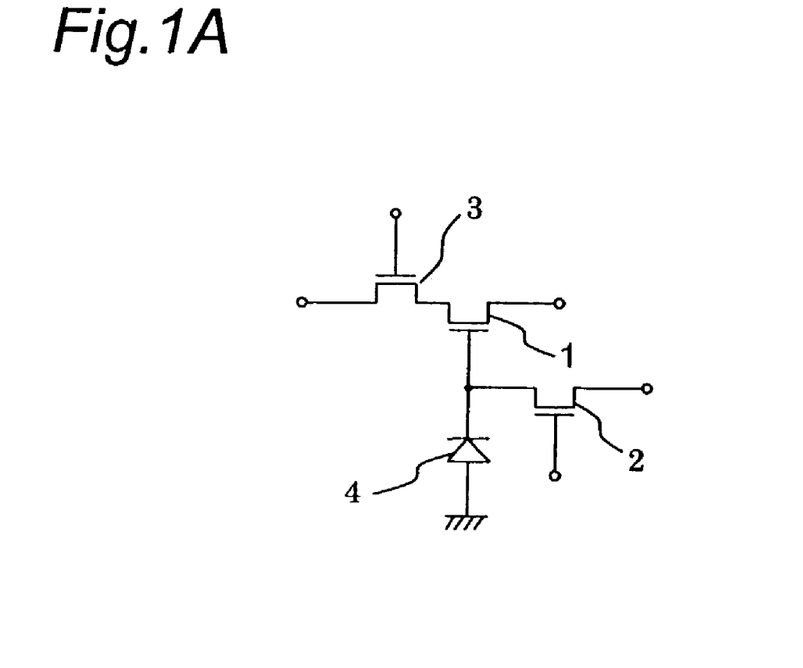
FIG. 1A is a view showing a circuit construction of a pixel of an amplification type solid-state image pickup device according to a first embodiment of the invention.
Figure 1B:
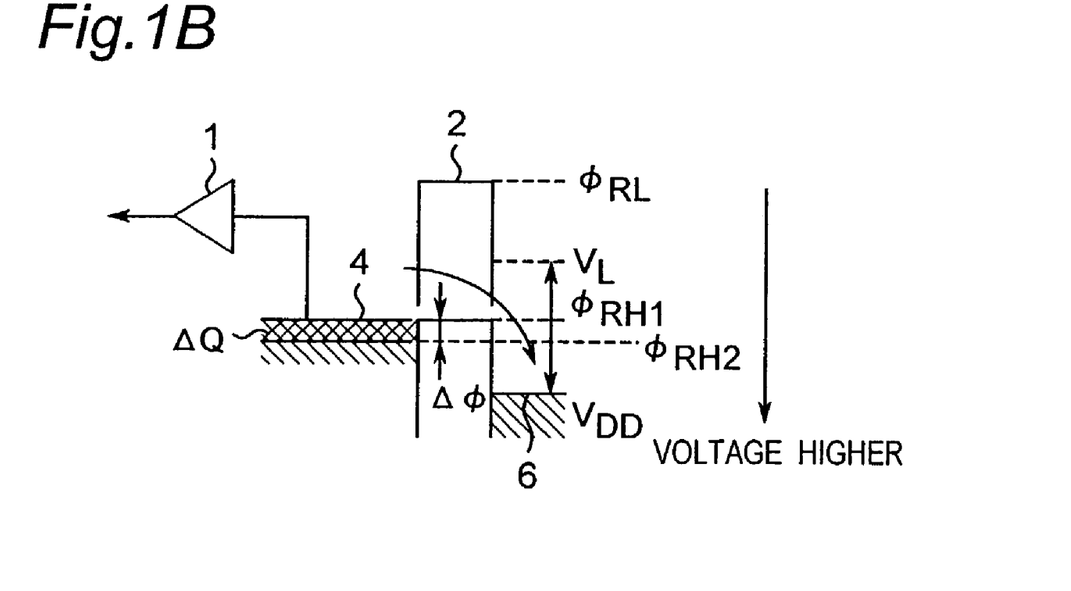
FIG. 1B is a potential diagram showing potential relations of the pixel.

FIG. 1A is a view showing a circuit construction of a pixel of an amplification type solid-state image pickup device according to a first embodiment of the invention, and FIG. 1B is a potential diagram showing potential relations of the pixel.

As shown in FIG. 1A, the pixel has an amplification-use MOS transistor 1, a reset-use MOS transistor 2, a pixel-selection-use MOS transistor 3, and a photodiode 4 as a photoelectric conversion device.

In the pixel of the amplification type solid-state image pickup device as constructed above, as shown in FIG. 1B, gate voltage of the reset-use MOS transistor 2 is changed in three steps. That is, the under-gate channel voltage with the gate voltage of the reset-use MOS transistor 2 at Low level is assumed to be $\phi_{RL}$, the under-gate channel voltage with the gate voltage of the reset-use MOS transistor 2 at High level 1 is assumed to be $\phi_{RH1}$, and the under-gate channel voltage with the gate voltage of the reset-use MOS transistor 2 at High level 2 (>High level 1) is assumed to be $\phi_{RH2}$. It is assumed here that $$\phi_{RH2} - \phi_{RH1} = \Delta\phi.$$

Also, the drain voltage of the reset-use MOS transistor 2 is changed in two steps. That is, the voltage of the drain of the reset-use MOS transistor 2 for High level is assumed to be a power supply voltage $V_{DD}$, and that for Low level is assumed to be $V_L$. It is assumed here that the power supply voltage $V_{DD}$ is a voltage higher than the under-gate channel voltage $\phi_{RH1}$, and $V_L$ is a voltage lower than the under-gate channel voltage $\phi_{RH1}$. The present invention is characterized in that the reset operation for the photodiode 4 is carried out in three steps. Now the reset operation is explained below.

First, with the gate of the reset-use MOS transistor 2 set to High level 1 as a first voltage (in this case, under-gate channel voltage=$\phi_{RH1}$), the reset drain voltage is lowered to $V_L$, and the photodiode 4 is hard reset to $V_L$ (first period).

Next, with the gate of the reset-use MOS transistor 2 remaining at High level 1, the reset drain voltage is returned to the power supply voltage $V_{DD}$, and the photodiode 4 is soft reset to a sub-threshold region around the under-gate channel voltage $\phi_{RH1}$ (second period).

Finally, with the reset drain voltage remaining at the power supply voltage $V_{DD}$, the gate of the reset-use MOS transistor 2 is changed to High level 2 (where under-gate channel voltage=$\phi_{RH2}=\phi_{RH1}+\Delta\phi$), by which a second soft reset operation is performed (third period). That the gate voltage of the reset-use MOS transistor has been elevated by $\Delta\phi$ in this third period is effectively equivalent to that charges $\Delta Q$ represented by $$\Delta Q = \Delta\phi \times C_p$$

have been injected to the photodiode 4, where discharge of excess charges begins immediately after that. That is, in this third period, it is equivalent to that after injection of a small quantity of charges, the soft reset operation is performed. It is noted that the capacitance $C_p$ is a capacitance of the photodiode 4 and a region adjoining thereto, and symbols used hereinbelow are of the same definitions as those for Equation (1).

Accordingly, noise occurring due to this operation can be expressed as shown below. Hereinbelow, a representation of $$\Delta\phi = (kT/q)/\alpha$$

is used for a simpler explanation. In the case of $\alpha > 2$, noise occurring to the photodiode 4 due to the second soft reset operation is expressed in electron number by the following equation (Bedabrata Pain et al., Analysis and enhancement of low-light level performance of photodiode-type CMOS active pixel imagers operated with sub-threshold reset, IEEE Workshop on CCDs and Advanced Image Sensors 1999, p.140):

$$\Delta Nsr2 = \sqrt{(\Delta\phi C_p/q)} = \sqrt{(kTC_p/\alpha)}/q \quad (3)$$

In a comparison of this Equation (3) with Equation (2), setting $\alpha$ to a value which is enough larger than 2 makes it possible for the present invention to reduce the noise to a larger extent than in the prior-art soft reset operation. For example, given $\alpha=8$, then the noise expressed in electron number can be reduced to 0.35 time that of the hard reset operation and 0.5 time that of the soft reset operation.

In addition, at room temperature, since $$(kT/q) = 26 \, mV,$$

the assumption that $\alpha=8$ yields $$\Delta\phi = 3 \, mV.$$

The resulting value is the under-gate channel voltage, equivalent to a gate voltage of about 4 mV in normal CMOS process.

Figure 2:
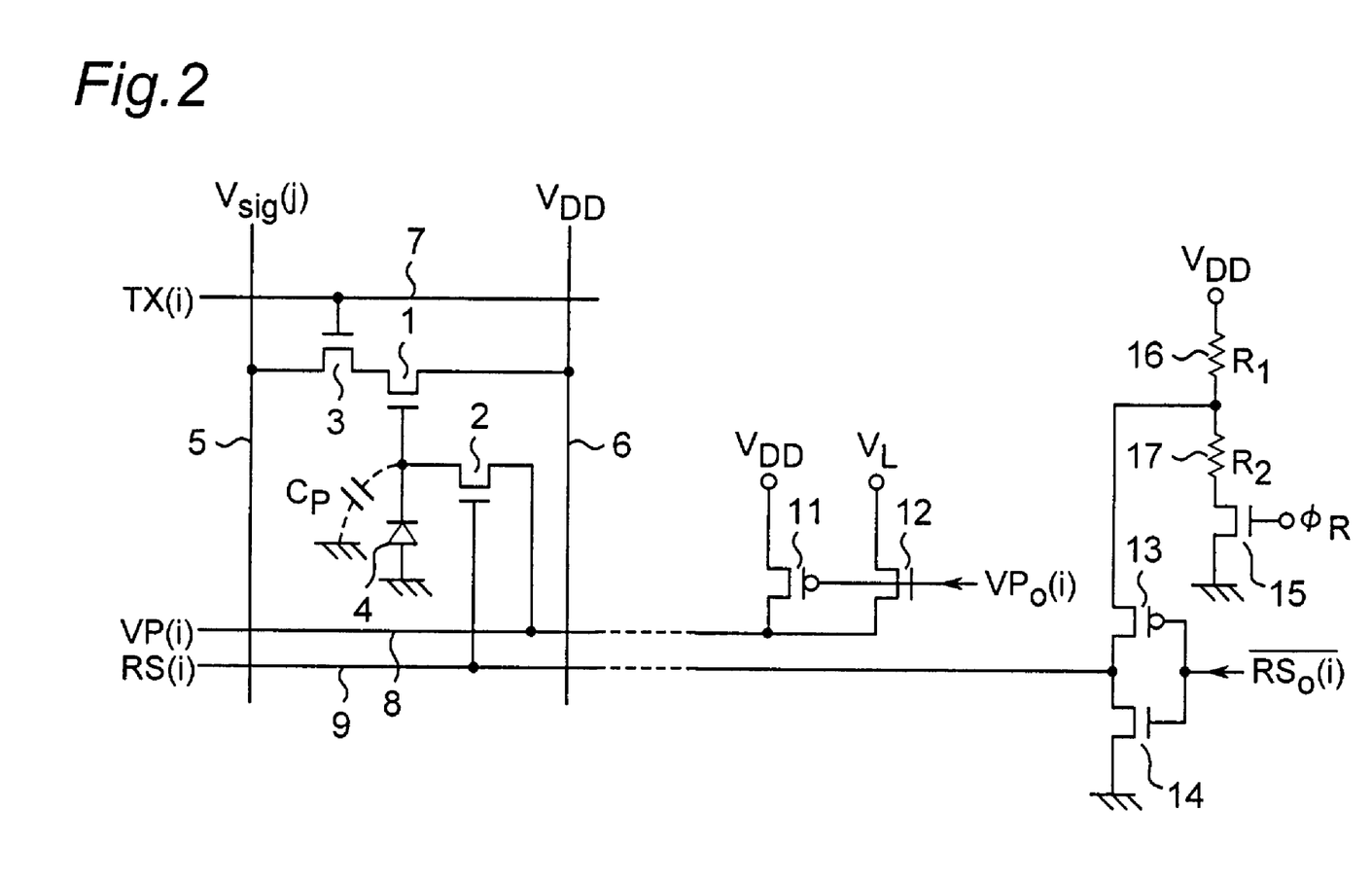
FIG. 2 is a view showing a circuit construction of main part of the amplification type solid-state image pickup device.

FIG. 2 is a view showing a circuit construction of an amplification type solid-state image pickup device using the pixel shown in FIG. 1A. Referring to FIG. 2, reference numeral 1 denotes an amplification-use MOS transistor, 2 denotes a reset-use MOS transistor the source of which is connected to the gate of the amplification-use MOS transistor 1, 3 denotes a pixel-selection-use MOS transistor the drain of which is connected to the source of the amplification-use MOS transistor 1, and 4 denotes a photodiode as a photoelectric conversion device the cathode of which is connected to the gate of the amplification-use MOS transistor 1 and the anode of which is connected to the ground, where the amplification-use MOS transistor 1, the reset-use MOS transistor 2, the pixel-selection-use MOS transistor 3 and the photodiode 4 constitute a pixel. This amplification type solid-state image pickup device is equipped with a plurality of pixels (only one shown in FIG. 2) arrayed in a matrix. The amplification-use MOS transistor 1, the reset-use MOS transistor 2, and the pixel-selection-use MOS transistor 3 are n-type MOS transistors.

Also, reference numeral 5 denotes a plurality of signal lines $V_{sig}(j)$ to which sources of the pixel-selection-use MOS transistors 3 are connected on the column basis, 6 denotes a plurality of power supply lines to which drains of the amplification-use MOS transistors 1 are connected on the column basis and which is connected to the power supply voltage $V_{DD}$, 7 denotes a pixel-selection clock line connected to the gate of the pixel-selection-use MOS transistor 3, 8 denotes a plurality of reset drain lines (reset drain voltage: VP(i)) to which drains of the reset-use MOS transistors 2 are connected on the row basis, and 9 denotes a plurality of reset gate lines (reset gate voltage: RS(i)) to which gates of the reset-use MOS transistors 2 are connected on the row basis. In FIG. 2, the signal lines 5, the power supply lines 6, the reset drain lines 8 and the reset gate lines 9 are shown each only one in number.

One end of the reset drain line 8 is connected to a p-type MOS transistor 11 and n-type MOS transistor 12. A pulse VPo(i) is inputted to the gates of MOS transistors 11 and 12. An output of an inverter constituted of MOS transistors 13, 14 is connected to one end of the reset gate line 9, and a signal $\overline{RS_o(i)}$ is inputted to the inverter. In this inverter, the drain of the source-grounded n-type MOS transistor 14 and the drain of the p-type MOS transistor 13 are connected to each other, and the gates of the MOS transistors 13, 14 are in common connection. One end of a resistor $R_1$ is connected to the source of the p-type MOS transistor 13, and the power supply voltage $V_{DD}$ is connected to the other end of the resistor $R_1$. Further, one end of a resistor $R_2$ is connected to one end of the resistor $R_1$, and the drain of an n-type MOS transistor 15 is connected to the other end of the resistor $R_2$, and moreover the source of the MOS transistor 15 is grounded. Then, a clock $\phi_R$ is inputted to the gate of the MOS transistor 15.

The MOS transistors 11 to 15 and the resistors $R_1$ and $R_2$ constitute a control means.

The reset drain voltage VP(i) is switched between power supply voltage $V_{DD}$ and $V_L$ by the MOS transistors 11, 12 and the pulse VPo(i). More specifically, with the pulse VPo(i) at Low level, the MOS transistor 11 turns on and the MOS transistor 12 turns off, so that the reset drain voltage VP(i) becomes power supply voltage $V_{DD}$ (i.e. High level). With the pulse VPo(i) at the High level, the MOS transistor 12 turns on and the MOS transistor 11 turns off, so that the reset drain voltage VP(i) becomes $V_L$ (i.e. Low level).

On the other hand, to the reset gate line 9 (reset gate voltage: RS(i)), an inverted signal of the signal $\overline{RS_o(i)}$ is applied by the inverter constituted of the MOS transistors 13, 14. In this case, the power supply of the inverter becomes the power supply voltage $V_{DD}$ when the clock $\phi_R$ applied to the gate of the MOS transistor 15 is at the Low level. However, when the clock $\phi_R$ is at the High level, the power supply voltage $V_{DD}$ is divided by a resistor $R_1$ and resistor $R_2$, thus falling to the following voltage:

$$V_{DD} - \Delta V = V_{DD} \cdot R_2 / (R_1 + R_2) \quad (4)$$

For example, on the assumption that $$R_1/R_2 = 1/750,$$

If $V_{DD} = 3$ V, then, $\Delta V = 4$ mV. This corresponds to the case explained in conjunction with FIG. 1B. It is noted that the turn-on resistance of the MOS transistor 15 is assumed to be sufficiently lower than the resistor $R_2$.

Figure 3A:
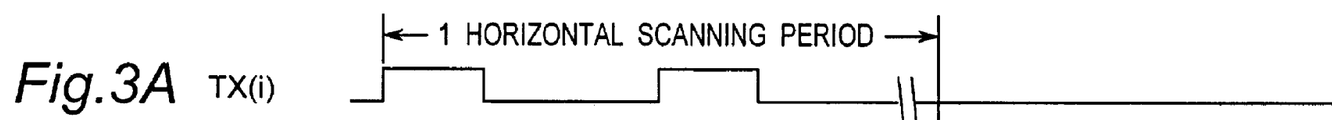
FIGS. 3A to 3K are timing charts of driving pulses of the amplification type solid-state image pickup device.
Figure 3B:
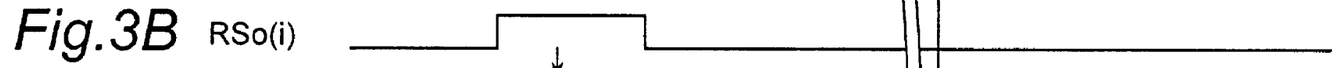
Figure 3C:
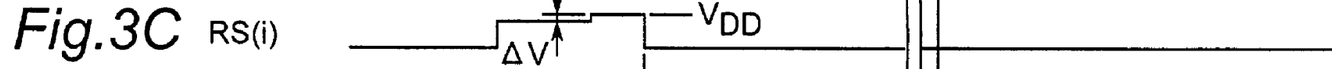
Figure 3D:
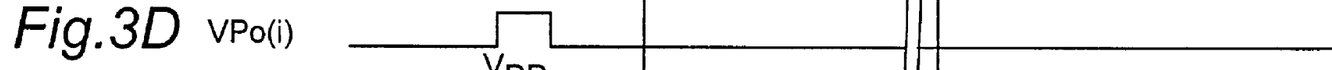
Figure 3E:
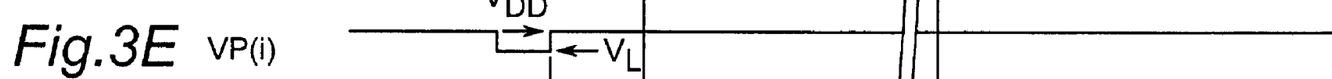
Figure 3F:
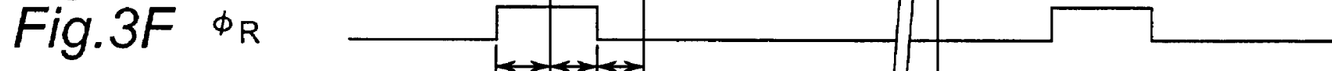
Figure 3G:
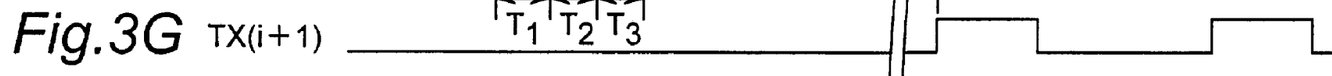
Figure 3H:
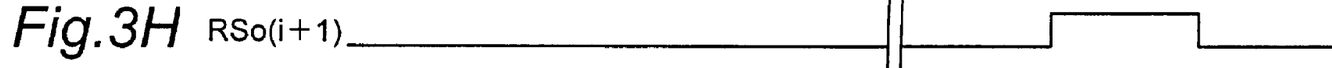
Figure 3I:
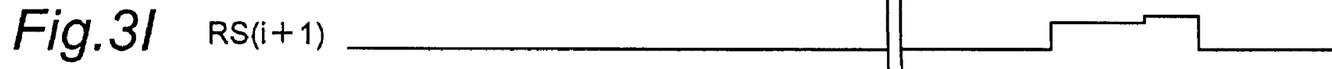
Figure 3J:
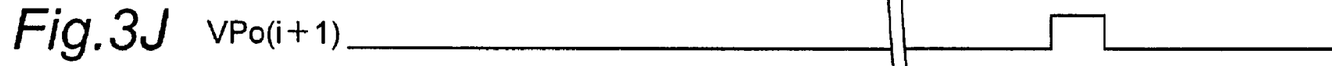
Figure 3K:
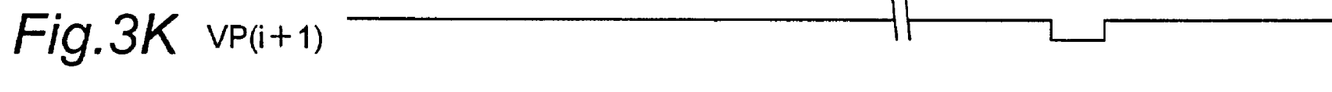

Operations in this case are shown in the timing charts of FIGS. 3A to 3K. FIG. 3A shows a signal TX(i), FIG. 3B shows a signal RSo(i), FIG. 3C shows a reset gate voltage RS(i), FIG. 3D shows a pulse VPo(i), FIG. 3E shows a reset drain voltage VP(i), FIG. 3F shows a clock $\phi_R$, FIG. 3G shows a signal TX(i+1), FIG. 3H shows a signal RSo(i+1), FIG. 3I shows a reset gate voltage RS(i+1), FIG. 3J shows a pulse VPo(i), and FIG. 3K shows a reset drain voltage VP(i+1). FIGS. 3A to 3E show reset operation timings during one horizontal scanning period for the i-th row, and FIGS. 3G to 3K show reset operation timings during one horizontal scanning period for the (i+1)-th row.

As shown in FIGS. 3A to 3F, in a reset period $(T_1 + T_2 + T_3)$ during which the reset gate voltage RS(i) keeps High level, during its first period $T_1$, the reset gate voltage RS(i) is set to $(V_{DD} - \Delta V)$ as the first voltage, while the reset drain voltage VP(i) becomes $V_L$, where satisfying a relationship that $$V_L < \phi_{RH1}$$

causes the photodiode 4 to be reset to the voltage $V_L$. That is, a hard reset operation is performed.

Next, in a second period $T_2$, the reset gate voltage RS(i) is held at $(V_{DD} - \Delta V)$ while the reset drain voltage VP(i) becomes the power supply voltage $V_{DD}$ where satisfying a relationship that $$V_{DD} > \phi_{RH}$$

causes the first soft reset operation to be performed.

Further, in a third period $T_3$, the reset drain voltage VP(i) is held at the power supply voltage $V_{DD}$ while the reset gate voltage RS(i) becomes the power supply voltage $V_{DD}$ as a second voltage, showing a $\Delta V$ increase from the preceding state, where an injection of a small quantity of charges and the second soft reset operation are performed. Given that $\Delta V = 4$ mV or so, noise caused by this operation can be reduced to 0.35 time that of the hard reset operation, and 0.5 time that of the soft reset operation, in terms of electron number, as described in conjunction with FIG. 1.

Consequently, according to the amplification type solid-state image pickup device of this first embodiment, reset noise can be reduced to a large extent with a simple construction.

Second Embodiment

Figure 4:
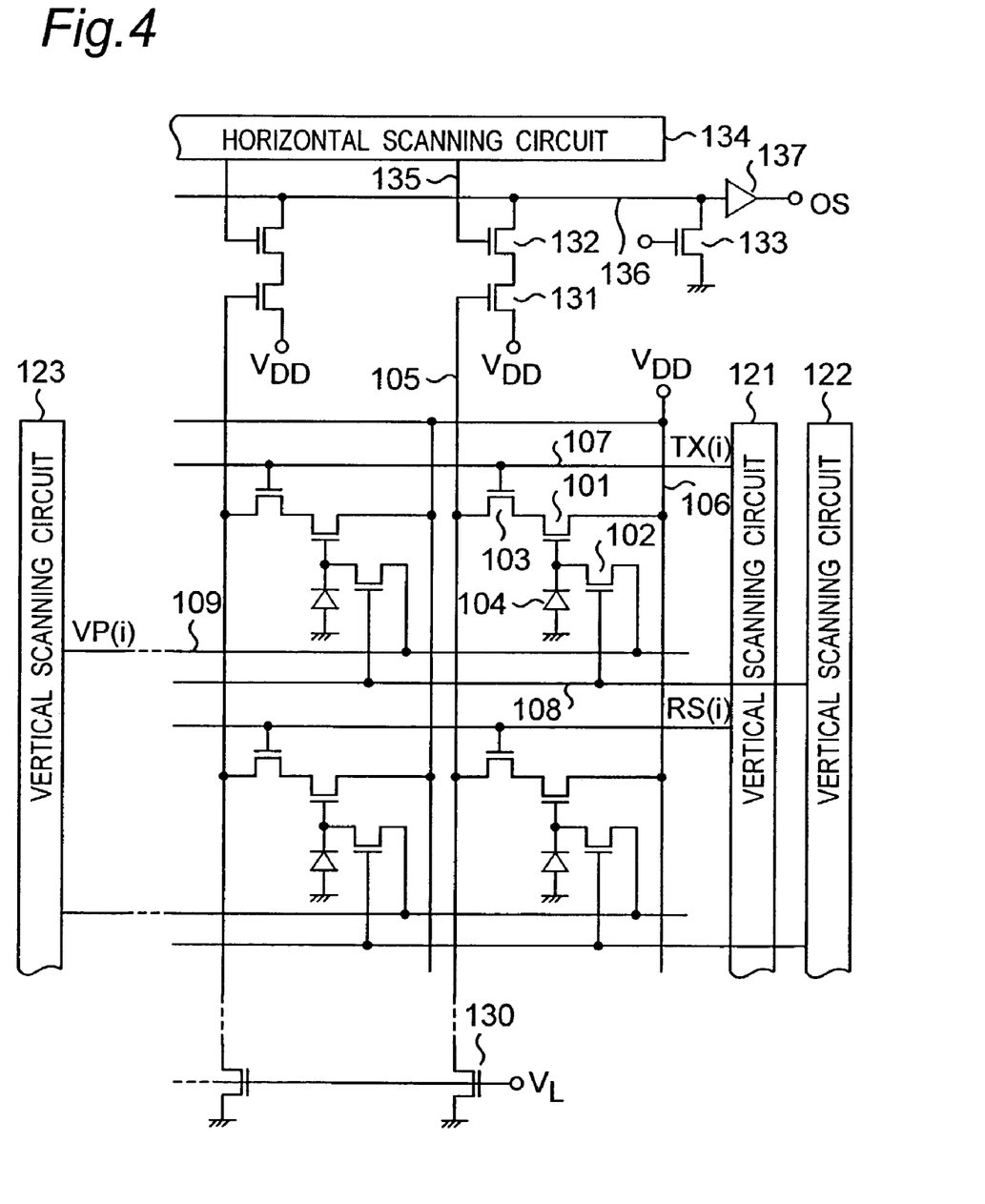
FIG. 4 is a view showing a circuit construction of main part of an amplification type solid-state image pickup device according to a second embodiment of the invention.

FIG. 4 is a view showing a circuit construction of main part of a two-dimensional amplification type solid-state image pickup device according to a second embodiment of the invention. The pixel construction of this amplification type solid-state image pickup device is similar to that of the pixel of the amplification type solid-state image pickup device of the first embodiment.

Referring to FIG. 4, reference numeral 101 denotes an amplification-use MOS transistor, 102 denotes a reset-use MOS transistor, 103 denotes a pixel-selection-use MOS transistor, 104 denotes a photodiode as a photoelectric conversion device, 105 denotes a signal line, 106 denotes a power supply line, 107 denotes a pixel-selection clock line, 108 denotes a reset clock line, and 109 denotes a reset-drain-use power supply line.

The gate of the pixel-selection-use MOS transistor 103 is driven by a vertical scanning circuit 121 as a third scanning circuit via the pixel-selection clock line 107. Also, the gate of the reset-use MOS transistor 102 is driven by a vertical scanning circuit 122 as a second scanning circuit via the reset clock line 108. Further, the drain of the reset-use MOS transistor 102 is driven by a vertical scanning circuit 123 as a first scanning circuit via the reset-drain-use power supply line 109. The vertical scanning circuit 122 and the vertical scanning circuit 123 constitute a control means.

Also, a MOS transistor 130 (gate bias voltage: $V_G$) serving as a constant-current load is connected to the signal line 105, and the voltage of the signal line 105 is read to a horizontal signal line 136 via an amplifier (amplification-use MOS transistor) 131 and a MOS transistor 132. The MOS transistor 132 is driven by a horizontal scanning circuit 134 via a horizontal clock line 135. Also, a MOS transistor 133 (gate bias voltage: $V_{L2}$), which serves as a constant-current load, is connected to the horizontal signal line 136, and a voltage of the horizontal signal line 136 is amplified by an amplifier 137 so as to be outputted as a signal OS.

As shown in FIG. 3C, a reset gate voltage RS(i) of a tri-level pulse composed of $V_{DD}$, $(V_{DD} - \Delta V)$ and Low level is applied to the reset clock line 108, and the vertical scanning circuit 122 serving for the drive thereof is given a tri-level pulse generating function as shown in FIG. 2.

Also, as shown in FIGS. 3A to 3K, a reset drain voltage VP(i) of a bi-level pulse composed of $V_L$ and $V_{DD}$ is applied to the reset drain line 109, and the vertical scanning circuit 123 serving for the drive thereof is given a bi-level pulse generating function as shown in FIG. 2.

The amplification type solid-state image pickup device of the above-described construction has functions and effects similar to those of the amplification type solid-state image pickup device of the first embodiment.

In this second embodiment, the drain of the reset-use MOS transistor 102 and the drain of the amplification-use MOS transistor 101 are different in connection line from each other. Since the amplification-use MOS transistors 101 are driven on the row basis, interconnecting the drains of the amplification-use MOS transistors 101 in the horizontal direction would cause drive currents to be concentrated to row-basis power supply lines, which leads to a possibility that the signal may be affected by wiring resistance. In contrast to this, in the case of the construction shown in FIG. 4, drains of the amplification-use MOS transistors 101 are connected to the power supply line 106 in the vertical direction on the column basis, so that the concentration of the drive currents can be avoided. Meanwhile, currents flowing through the drains of the reset-use MOS transistors 102 are those due to discharging of electric charges of the photodetection part (photodiode 104) as well as to charging and discharging of the capacitance, so being small that interconnecting the drains of the reset-use MOS transistors 102 by the reset-drain-use power supply line 109 in the horizontal direction has no problem.

Also, although the drains of the reset-use MOS transistors 102 and the drains of the amplification-use MOS transistors 101 are different in connection lines from each other in the second embodiment, yet the present invention is not limited to this. Since it is a period during which the pixel-selection-use MOS transistor 103 holds on, i.e., a period during which the signal TX(i) in FIG. 3A keeps at High level, that a current flows through the amplification-use MOS transistor 101, it is implementable to use the reset drain voltage VP(i) in common. Accordingly, even if the drive currents for the amplification-use MOS transistors 101 are concentrated to the row-basis power supply lines 106, a devising for preventing any effects of the wiring resistance makes it allowable that, although not shown, the drains of the amplification-use MOS transistors and the drains of the reset-use MOS transistors are made common in connection lines so that the reset drain voltage VP(i) derived from the vertical scanning circuit 123 or the like is applied thereto.

The above first and second embodiments have been described each on an amplification type solid-state image pickup device in which a plurality of pixels are arrayed in a matrix. However, it is needless to say that the pixel array is not limited to this.

As apparent from the above description, according to the amplification type solid-state image pickup device of the present invention, reset noise can be reduced to a large extent by performing the hard reset operation and its succeeding first soft reset operation, and by thereafter performing injection of a small quantity of charges and the second soft reset operation. As a consequence of the above, the present invention comes extremely useful for the formation of high-performance image sensors.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplification type solid-state image pickup device having an array of a plurality of pixels each of which comprises: a photoelectric conversion device; a signal-amplification-use MOS transistor for amplifying signal charges stored in the photoelectric conversion device; a reset-use MOS transistor for resetting signal charges stored in the photoelectric conversion device; and a pixel-selection-use MOS transistor for selecting a signal amplified by the signal-amplification-use MOS transistor, wherein
a reset period during which the reset-use MOS transistor is turned and held on comprises a first period, a second period and a third period,
the amplification type solid-state image pickup device further comprising control means for performing control operations that during the first period, drain voltage of the reset-use MOS transistor is turned and held in a Low state while gate voltage of the reset-use MOS transistor is set to a first voltage; during the second period, the drain voltage of the reset-use MOS transistor is turned and held in a High state while the gate voltage of the reset-use MOS transistor is held at the first voltage; during the third period, while the drain voltage of the reset-use MOS transistor is held in the High state, the gate voltage of the reset-use MOS transistor is set to a second voltage higher than the first voltage by a specified voltage.

2. The amplification type solid-state image pickup device according to claim 1, wherein
given that the specified voltage is ΔV, a condition that $$\Delta V \leq kT/(2q)$$

(where k is Boltzmann's constant, T is an absolute temperature, and q is the elementary electric charge) is satisfied.

3. The amplification type solid-state image pickup device according to claim 1, wherein
if an under-gate channel voltage of the reset-use MOS transistor resulting when the gate voltage of the reset-use MOS transistor is the first voltage is assumed to be $\phi_{RH}$, then the voltage of the drain of the reset-use MOS transistor in a High state is higher than the under-gate channel voltage $\phi_{RH}$ of the reset-use MOS transistor and the voltage of the drain of the reset-use MOS transistor in a Low state is lower than the under-gate channel voltage $\phi_{RH}$ of the reset-use MOS transistor.

4. The amplification type solid-state image pickup device according to claim 1, wherein
the plurality of pixels are arrayed in a matrix and wherein the control means comprises:
a first scanning circuit to which drains of the reset-use MOS transistors of the plurality of pixels are connected on a row basis, and which serves for applying a bi-level pulsed drive voltage to the drains of the reset-use MOS transistors one after another on the row basis; and
a second scanning circuit to which gates of the reset-use MOS transistors of the plurality of pixels are connected on a row basis, and which serves for applying a tri-level pulsed drive voltage to the gates of the reset-use MOS transistors one after another on the row basis.

5. The amplification type solid-state image pickup device according to claim 4, wherein
the amplification-use MOS transistor and the pixel-selection-use MOS transistor are connected in series to each other, the amplification type solid-state image pickup device further comprising:
a signal line to which one end out of both ends of the amplification-use MOS transistor and the pixel-selection-use MOS transistor connected in series is connected;
a power supply line to which the other end out of both ends of the amplification-use MOS transistor and the pixel-selection-use MOS transistor connected in series is connected; and
a third scanning circuit to which gates of the pixel-selection-use MOS transistors are connected on a row basis, and which serves for applying a pulsed drive voltage to the gates of the pixel-selection-use MOS transistors one after another on the row basis.

* * * * *